United States Patent
Chang et al.

(10) Patent No.: US 7,697,114 B2
(45) Date of Patent: Apr. 13, 2010

(54) METHOD AND APPARATUS FOR COMPENSATED ILLUMINATION FOR ADVANCED LITHOGRAPHY

(75) Inventors: Shih-Ming Chang, Hsin-Chu (TW); Wen-Chuan Wang, Hsin-Chu (TW); Chih-Cheng Chin, Hsin-Chu (TW); Chi-Lun Lu, Hsinchu (TW); Sheng-Chi Chin, Hsin-Chu (TW); Hung Chang Hsieh, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 311 days.

(21) Appl. No.: 11/424,173

(22) Filed: Jun. 14, 2006

(65) Prior Publication Data
US 2007/0291244 A1 Dec. 20, 2007

(51) Int. Cl.
*G03B 27/54* (2006.01)
*G03B 27/72* (2006.01)

(52) U.S. Cl. .......................................... 355/67; 355/71

(58) Field of Classification Search ................... 355/53, 355/67, 71, 72, 69; 430/5, 311; 356/237.2
See application file for complete search history.

(56) References Cited

U.S. PATENT DOCUMENTS

| | | | | |
|---|---|---|---|---|
| 5,288,567 | A * | 2/1994 | Sakamoto et al. | 430/5 |
| 6,721,033 | B1 * | 4/2004 | Kaneko | 355/52 |
| 2002/0177048 | A1 * | 11/2002 | Saitoh et al. | 430/5 |
| 2003/0160949 | A1 * | 8/2003 | Komatsuda et al. | 355/71 |
| 2004/0246474 | A1 * | 12/2004 | Guetta et al. | 356/237.2 |
| 2004/0248043 | A1 * | 12/2004 | Shiraishi | 430/311 |
| 2005/0162632 | A1 * | 7/2005 | Taniguchi et al. | 355/69 |

\* cited by examiner

*Primary Examiner*—Peter B Kim
(74) *Attorney, Agent, or Firm*—Haynes and Boone, LLP

(57) ABSTRACT

Disclosed is a lithography system. The lithography system includes a source designed to provide energy; an imaging system configured to direct the energy onto a substrate to form a predefined image thereon, and defining an optical axis; and an aperture incorporated with the imaging system, the aperture having a plurality of transmitting regions defined along radial axis not parallel to the optical axis, and each transmitting region operable to transmit the energy with adjustable intensity.

26 Claims, 5 Drawing Sheets

US 7,697,114 B2

METHOD AND APPARATUS FOR COMPENSATED ILLUMINATION FOR ADVANCED LITHOGRAPHY

BACKGROUND

Semiconductor integrated circuit (IC) technology has experienced rapid progress including the continued minimization of feature sizes and the maximization of packing density. The minimization of feature size relies on improvement in photolithography and its ability to print smaller features or critical dimensions (CD). However, a photomask used in photolithography may suffer an angle-dependent CD difference, in which pattern features such as lines may have different widths when disposed from different directions. For example, a photomask may have an X-Y CD difference, 45-135 degree CD difference, or any other angle related CD difference. These CD differences often cause lithography patterning degradation, wafer manufacturing quality issues, and even yield concerns.

BRIEF DESCRIPTION OF THE DRAWINGS

The present disclosure is best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIGS. 2a to 2g are schematic views of various embodiments of an aperture, which can be integrated into the lithography system of FIG. 1 and can implement compensation illumination.

DETAILED DESCRIPTION

Figure 1:
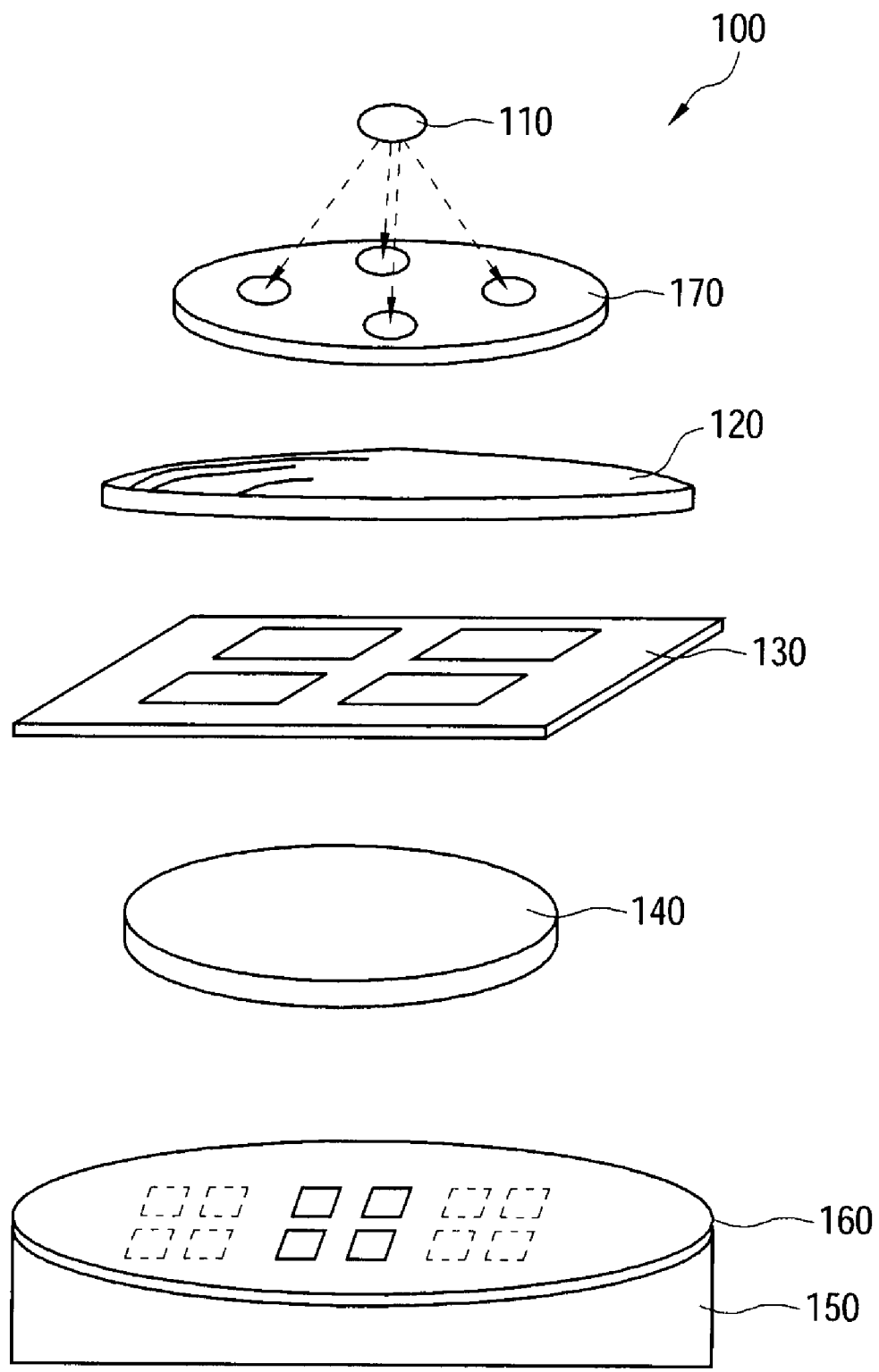
FIG. 1 is a schematic view of an exemplary embodiment of a lithography system capable of compensation illumination.

It is understood that the following disclosure provides many different embodiments, or examples, for implementing different features of the invention. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

Referring to FIG. 1, in one embodiment, a lithography system 100 includes a radiation source (or source) 110. The radiation source 110 may be any suitable light source. For example, the source 110 may be a mercury lamp having a wavelength of 436 nm (G-line) or 365 nm (I-line); a Krypton Fluoride (KrF) excimer laser with wavelength of 248 nm; an Argon Fluoride (ArF) excimer laser with a wavelength of 193 nm; a Fluoride ($F_2$) excimer laser with a wavelength of 157 nm; or other light sources having a desired wavelength (e.g., below approximately 100 nm). The radiation source may include an optical source selected from the group consisting of ultraviolet (UV) source, deep UV (DUV) source, extreme UV (EUV) source, and X-ray source. The radiation source may alternatively include a particle source selected from the group consisting of electron beam (E-Beam) source, ion beam source, and plasma source.

It is understood that in the above description of light sources, each light source may have a certain wavelength distribution, or line width, rather than an exact single wavelength. For example, the I-line (e.g., 365 nm) wavelength of the mercury lamp may not be exactly 365 nm, but may be centered at approximately 365 nm with a range of varying wavelengths extending above and below 365 nm. This range may be used to determine a minimum possible line width during photolithography, with less variation from the desired 365 nm wavelength resulting in a thinner line width.

The lithography system 100 includes an illumination system (e.g., a condenser) 120. The illumination system 120 may comprise a single lens or a lens system having multiple lenses and/or other lens components. For example, the illumination system 120 may include microlens arrays, shadow masks, and/or other structures designed to aid in directing light from the light source 110 onto a photomask.

During a lithography patterning process, a photomask (also referred to as a mask or a reticle) 130 may be included in the lithography system 100. The photomask 130 includes a transparent substrate and a patterned absorption layer. The transparent substrate may use fused silica ($SiO_2$) relatively free of defects, such as borosilicate glass and soda-lime glass. The transparent substrate may use calcium fluoride and/or other suitable materials. The patterned absorption layer may be formed using a plurality of processes and a plurality of materials, such as depositing a metal film made with chromium (Cr) and iron oxide, or an inorganic film made with MoSi, ZrSiO, SiN, and/or TiN. A light beam may be partially or completely blocked when directed on an absorption region. The absorption layer may be patterned to have one or more openings through which a light beam may travel without being absorbed by the absorption layer. The mask may incorporate other resolution enhancement techniques such as phase shift mask (PSM) and/or optical proximity correction (OPC).

The lithography system 100 includes an objective lens 140. The objective lens 140 may have a single lens element or a plurality of lens elements. Each lens element may include a transparent substrate and may further include a plurality of coating layers. The transparent substrate may be a conventional objective lens, and may be made of fused silica ($SiO_2$), calcium-fluoride ($CaF_2$), lithium fluoride (LiF), barium fluoride ($BaF_2$), or other suitable material. The materials used for each lens element may be chosen based on the wavelength of light used in the lithography process to minimize absorption and scattering. The illumination lens 120 and the objective lens 140 are collectively referred to as an imaging lens. The imaging lens may further include additional components such as an entrance pupil and an exit pupil to form an image defined in the photomask 130 on a substrate to be patterned.

The lithography system 100 may further include a substrate stage 150 capable of securing and moving a substrate in translational and rotational modes such that the substrate may be aligned with the photomask 130.

In the present example, a substrate 160 may be provided in the lithography system 100 for receiving a lithography process. The substrate 160 may be a semiconductor wafer comprising an elementary semiconductor such as crystal silicon, polycrystalline silicon, amorphous silicon, germanium, and diamond, a compound semiconductor such as silicon carbide and gallium arsenic, an alloy semiconductor such as SiGe, GaAsP, AlInAs, AlGaAs, and GaInP, or any combination thereof. The substrate 160 may also have a photoresist coating layer formed thereon during the lithography process.

The lithography system 100 includes an aperture 170 having a plurality of radiation-transmitting regions (or illumination poles) to transmit radiation energy from the radiation source 110. The aperture 170 may be positioned between the radiation source 110 and the condenser 120 in the lithography system 100 and the plurality of radiation-transmitting regions are defined along radial axis perpendicular to the optical axis. Each radiation-transmitting region is designed to transmit radiation with an adjustable intensity and is operable to provide asymmetric illumination such that angle-related CD error is substantially eliminated, thus referred to as compensation illumination. Each radiation-transmitting region may additionally or alternatively be designed to transmit radiation with an adjustable phase (radiation wave phase), polarization (radiation wave polarization), or combinations thereof. Each radiation-transmitting region may be designed to be in various shapes, sizes, and/or be disposed away from the optical axis for off-axis illumination. The plurality of radiation-transmitting regions may be designed to be separate from each other or contacting each other to form a continuous area. The plurality of radiation-transmitting regions may be further designed to have various radiation intensities, radiation wave phases (such as optical phase), radiation polarizations (such as optical polarization), or combinations thereof utilized by various methods and materials including but not limited to: glass with a tunable tilt angle; multicoated glass with predefined transmittance; two optical polarizers stacked with a specific angle between polarizing directions thereof; liquid crystal sandwiched between two polarizers (parallel or orthogonal) controllable to tune intensity, phase, polarization, or combinations thereof when properly integrated with electrodes; or controllable radiation-blocking mechanisms having various structures such as a window blind structure or a camera shutter. The aperture 170 may be designed operable to eliminate angle-related CD error.

The lithography system 100 may also incorporates other techniques and components. For example, the lithography system may also include components and mechanism to implement an immersion lithography process. Illustrated and described below are several exemplary embodiments of the aperture 170.

Figure 2A:
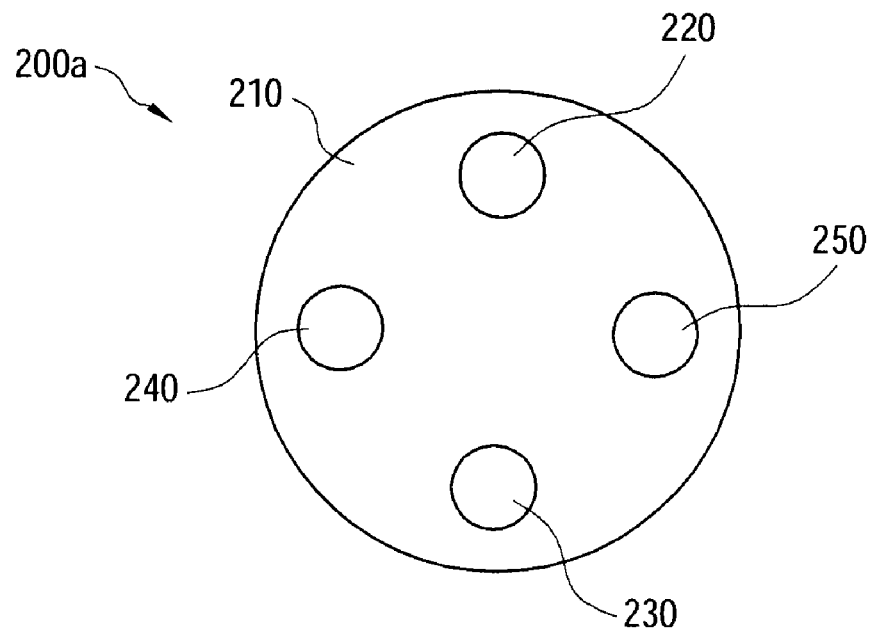

FIG. 2a illustrates an exemplary embodiment of an aperture 200a that can be incorporated in the lithography system 100. The aperture 200a may include a plate 210 being opaque to the radiation so that the radiation illuminated on the plate 210 will be blocked thereby from transmitting through. The plate 210 may be made of a metal, metal alloy, or other proper material. The plate 210 may include proper coating materials. The plate 210 may have a circular perimeter defining a center to be aligned with the optical axis during a lithography process.

The aperture 200a further includes two pairs of radiation-transmitting regions (or quadruple) defined in the plate 210. A first pair of radiation-transmitting regions 220 and 230 are positioned in a first diametrical axis and on opposite sides of the optical axis. A second pair of radiation-transmitting regions 240 and 250 are positioned in a second diametrical axis and on the opposite sides of the optical axis. The second diametrical axis is perpendicular to the first diametrical axis, as illustrated in FIG. 2a. The regions of the second pair have a different radiation-transmitting behavior.

Figure 2B:
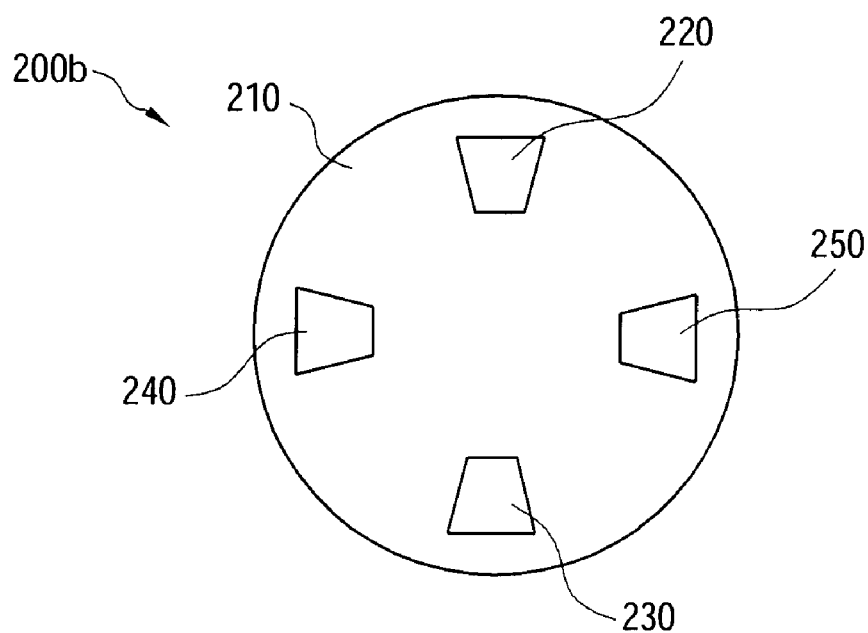

Each radiation-transmitting region may be defined in various shapes such as round, square, trapezoid, or other proper shapes. FIG. 2b illustrates another example of an aperture 200b having two pairs of radiation-transmitting regions in trapezoid shape. Each pair of radiation-transmitting regions, such as the first pair 220 and 230, may be symmetrically designed for transmittance symmetrical relative to the optical axis. For example, each pair of radiation-transmitting regions may be designed to have a same geometrical shape, have a same size, be equally distanced from the center of the aperture, and have a same transmittance.

Each radiation-transmitting region may be made of a transparent or translucent material, an opening, or an opening covered with a transmitting material such as glass, liquid crystal, polarizers, or combinations thereof, to utilize an adjustable transmittance.

During a lithography exposing process, a first pair of radiation beams illuminates through the first pair of radiation-transmitting regions 210 and 220, and a second pair of radiation beams illuminates through the second pair of radiation-transmitting regions 230 and 240. The aperture is designed and configured such that the first pair of radiation beams and the second pair of radiation beams are not equal in terms of intensity, phase, polarization, or combinations thereof. For example, the first pair of openings 210 and 220 and the second pair of openings are symmetrically designed around the center of the aperture 200a. The first pair of openings 210 and 220 are covered by a first type of glasses with a first transmittance utilized by multilayer coating. The second pair of openings 230 and 240 are covered by a second type of glasses with a second transmittance. The first and the second transmittances are different so that to compensate an angle-related CD error during a lithography exposing process. Before a lithography exposing process with a mask, a pair of glasses may be selected from a set of manufactured glasses each pair having an individual coating structure and transmittance, and disposed in the first pair of openings. Then another pair of glasses may be selected from the set of manufactured glasses and disposed in the second pair of openings such that the angle related CD error is substantially eliminated. When the same condition, including lithography system setup and mask, is used for patterning a plurality of wafers, the aperture 200a may keep its configuration (including quadruple intensities) for eliminating angle-related CD error until another adjustment to the aperture is necessary. The set of manufactured glasses may be made of fused silica, calcium fluoride, or other suitable material. The coating materials applied to the glass may include a metal film made with MoSi, ZrSiO, SiN, and/or TiN.

The described aperture 200a may be alternatively or additionally used for reducing patterning errors caused by other factors. In another example, each pair of glasses may additionally or alternatively have a different thickness such that radiation wave phase through each pole may also be adjustable. In another example, a first pair of glasses and the second pair of glasses are substantially similar, each glass being secured to a corresponding opening and having a mechanism of adjusting tilt angle. Thus configured with a mechanism of adjusting intensity, phase, polarization, or combinations thereof, the aperture may be positioned such that two pairs of poles in orthogonal axes are aligned with orthogonal features (referred to as horizontal features and vertical features, respectively or X-Y oriented features) formed on a wafer. Both horizontal features and vertical features on a wafer may have a reduced angle-related CD error. Further, Horizontal features and vertical features may be substantially decoupled for independent adjustment. For example, vertical features may be determined by a horizontal pair of radiation-transmitting regions and horizontal features may be determined by a vertical pair of radiation-transmitting regions.

Figure 2C:
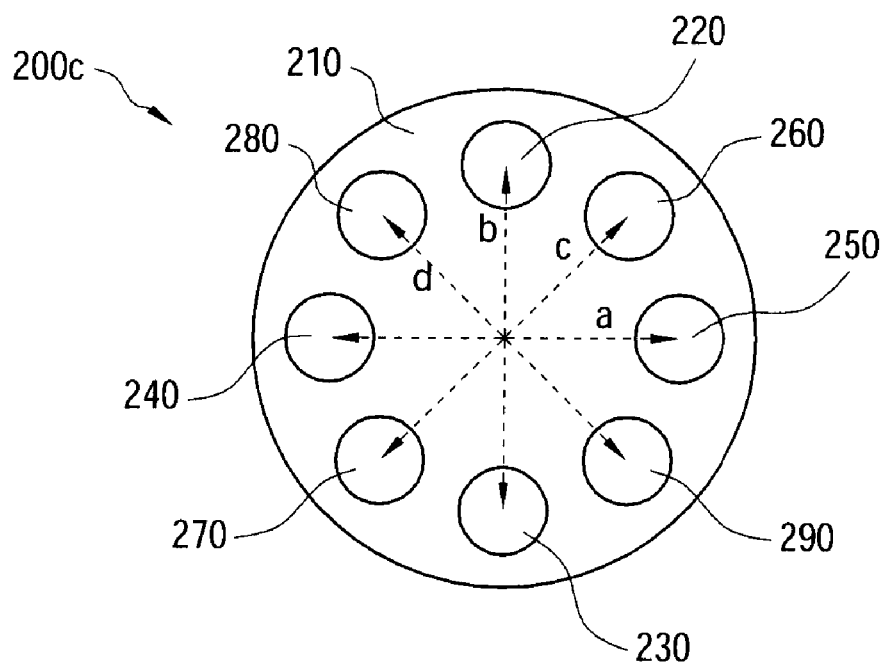

FIG. 2c illustrates another exemplary embodiment of an aperture 200c that can be incorporated in the lithography system 100. The aperture 200c may include a plate 210, substantially similar to the one illustrated in FIG. 2a.

The aperture 200c includes two pairs of radiation-transmitting regions defined in the plate 210. A first pair of radiation-transmitting regions 220 and 230 are positioned in a first diametrical axis (labeled as 'a' in FIG. 2c) and on opposite sides of the optical axis. A second pair of radiation-transmitting regions 240 and 250 are positioned in a second diametrical axis ('b') and on the opposite sides of the optical axis. The second diametrical axis is perpendicular to the first diametrical axis.

The aperture 200c further includes a third pair of radiation-transmitting regions 260 and 270 and a fourth pair of radiation-transmitting regions 280 and 290 defined in the plate 210. The third pair of radiation-transmitting regions 260 and 270 are positioned on opposite sides of the optical axis and in a third diametrical axis ('c'). The fourth pair of radiation-transmitting regions 280 and 290 positioned in a fourth diametrical axis ('d') and on the opposite sides of the optical axis. The third and fourth diametrical axes are perpendicular to each other. The third diametrical axis is 45 degrees away from the first diametrical axis anticlockwise around the center. The fourth diametrical axis is 45 degrees away from the first diametrical axis clockwise around the center. The aperture 200c has a similar mechanism of adjusting intensity, phase, polarization, or combinations thereof.

Figure 2D:
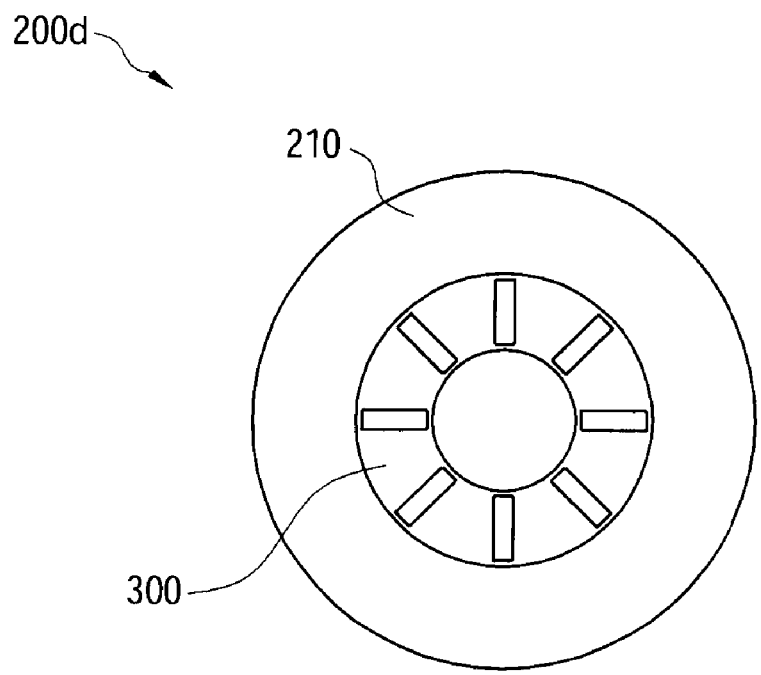
Figure 2E:
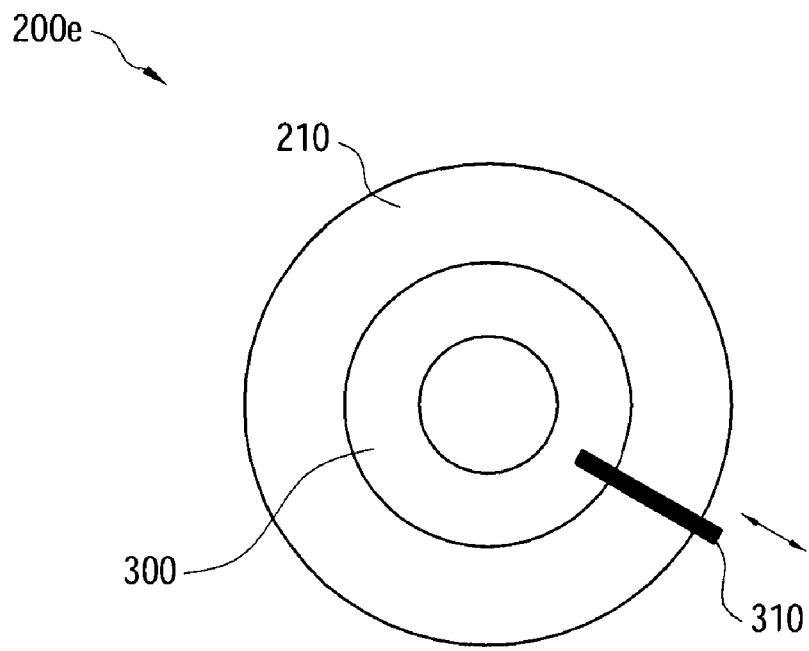

FIG. 2d illustrates another exemplary embodiment of an aperture 200d that can be incorporated in the lithography system 100. The aperture 200d may include a plate 210, substantially similar to the one illustrated in FIG. 2a. The aperture 200d includes a plurality of radiation-transmitting regions formed in a circular area 300. Each radiation-transmitting region may be disposed in various axial directions such as X (or horizontal), Y (or vertical), 45 degrees, and various other directions. Each radiation-transmitting region may have a pre-determined transmitted intensity. The transmitted intensity may have a step-wise change or continuously change around the circle to implement compensation illumination. In one example, the radiation-transmitting regions may have a gradient transmittance predetermined for compensation illumination. The transmitted intensity may have a diametrical symmetry but at least orthogonal asymmetry. The change of transmitted intensity may be implemented through varying transmittance, using various methods introduced in previous embodiments such as tilted glassed or coated glasses. Alternatively, the change of transmitted intensity may be implemented through varying width of radiation-transmitting regions measured along the radial axis, using various methods. As an example, FIG. 2e illustrates an exemplary embodiment of an aperture 2e having a plate 210 and a circular radiation transmitting region 300. The circular radiation-transmitting region 300 have a plurality of radiation-blocking features 310 (only exemplary one is shown in FIG. 2e) configured with a mechanism of moving inward to or outward from the center of the aperture to adjust the intensity of a beam transmitted through. Such aperture is capable of providing an asymmetric illumination and reducing an angle-related CD error or other patterning defects.

Figure 2F:
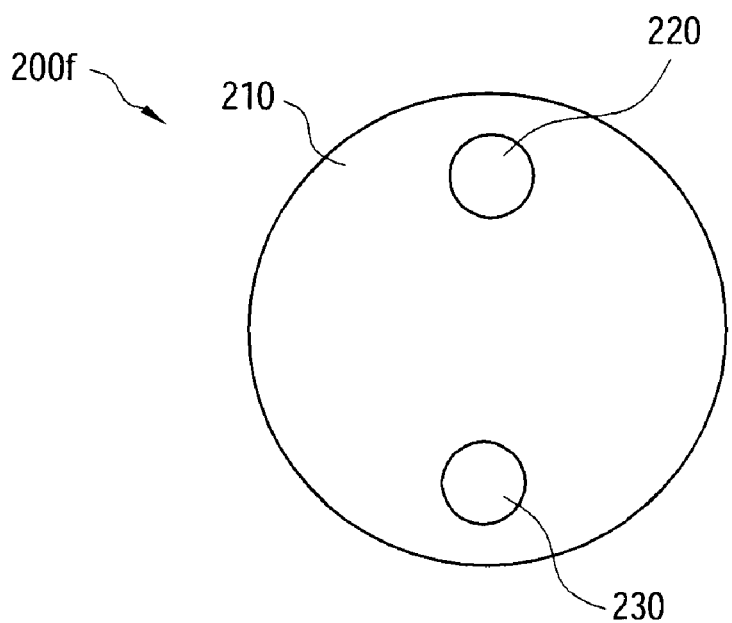

FIG. 2f illustrates another exemplary embodiment of an aperture 200f that can be incorporated in the lithography system 100. The aperture 200f may include a plate 210, substantially similar to the one illustrated in FIG. 2a. The aperture 200f includes only one pair of radiation-transmitting regions (dipole) defined in the plate 210. The pair of radiation-transmitting regions 220 and 230 are positioned in a diametrical axis and on opposite sides of the optical axis. The pair of radiation-transmitting regions 220 and 230 may only be a pair of openings, or different material with a fixed transmittance such as a pair of coated glass, or different material with a similar mechanism of adjusting intensity, phase, polarization, or combinations thereof. An angle-related CD error can be reduced using the aperture 200f and implementing a proper processing method. For example, the aperture 200f may be positioned such that the optical axis is perpendicular to the aperture 200f and passes through the center of the aperture but the diametrical axis of the pair of regions is in a direction parallel to horizontal features on a wafer to be patterned. In another example as illustrated in FIG. 2g, the diametrical axis of the pair of regions is in a direction parallel to vertical features on a wafer to be patterned. The wafer is exposed to the radiation for a first radiation dose adjustable by exposing time, transmittance, or combinations thereof. Then the aperture 200f is rotated around the optical axis of 90 degrees such that the diametrical axis is in a direction parallel to vertical features (or horizontal features) on the wafer. The wafer is exposed for a second dose adjustable by exposing time, transmittance, or combinations thereof. The second exposing dose is different from the first exposing dose in term of intensity to implement an asymmetric illumination, adjustable to substantially reduce an angle-related CD error or other patterning defects. Alternatively, multiple exposing process may be implemented for improved patterning. For example, the aperture may be rotate such that the illumination dipole may be along other directions.

Figure 3:
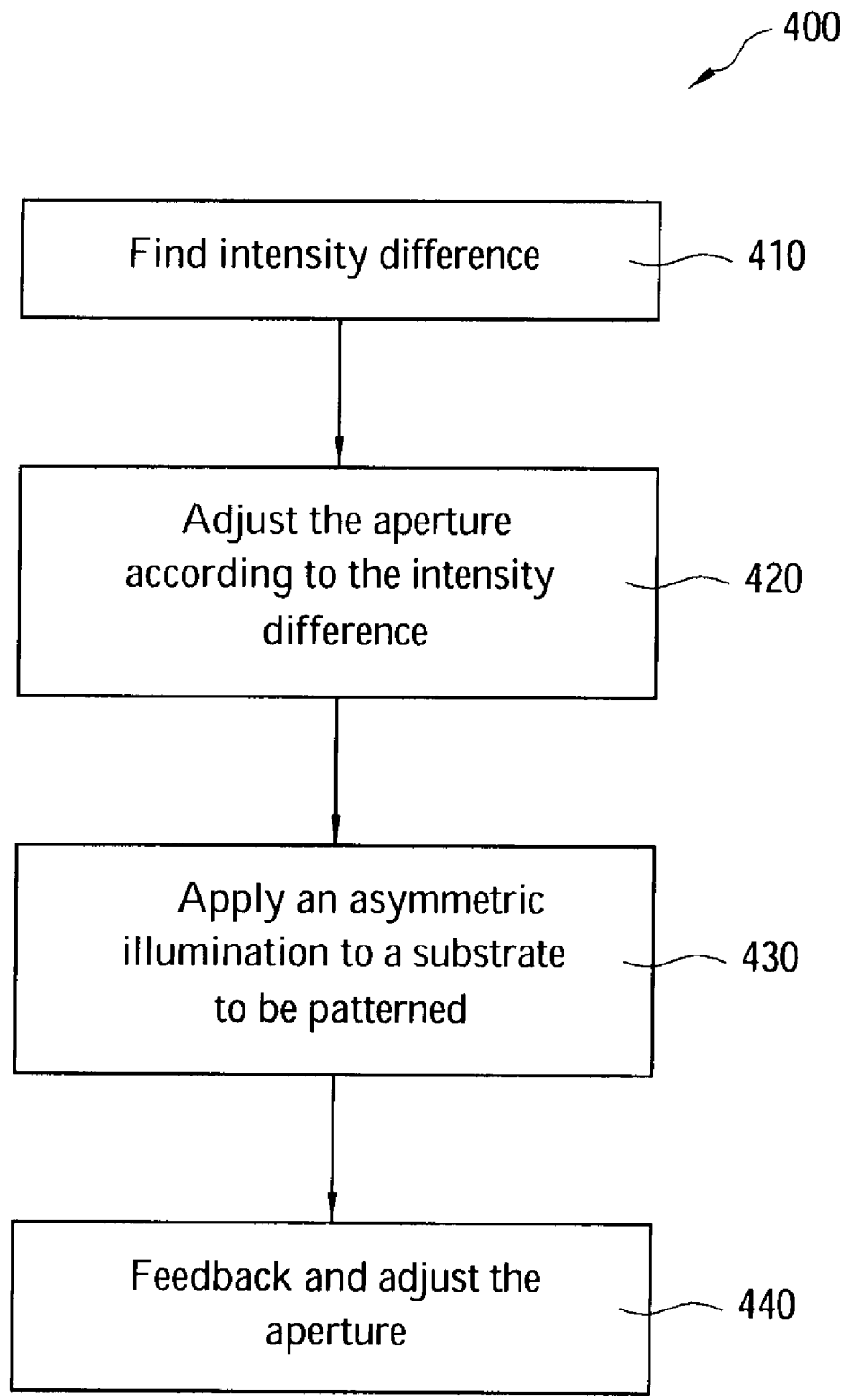
FIG. 3 is a flowchart of a method to implement compensation illumination using the lithography system of FIG. 1.

FIG. 3 illustrates a method 400 to implement compensation illumination in the lithography system 100 having an asymmetric aperture of adjustable intensity, phase, polarization, or combinations thereof.

The method may begin at step 410 by measuring the angular CD difference on the mask. This can be done by measuring the vertical, horizontal, 45 degrees, and 135 degrees line patterns.

The second step 420 is to measure the angular difference of the imaging system. This can be done through various methods. For example, an exposure process may be carried out in the lithography system 100 but with a traditional aperture having a symmetrical illumination or the aperture 170 adjusted to lack of compensation illumination. A mask having a pattern to be transferred and a test wafer may be used. The mask may include a CD mark having orthogonal features (such as a horizontal feature and a vertical feature). The pattern of the CD mark formed on the substrate is then measured. A width difference between the horizontal line and vertical line in the CD mark on the wafer may be extracted and further used to find out relevant intensity difference in order to compensate this angle-related CD error, according to some experimental data such as width vs. illumination dose. Other proper methods may be alternatively used.

The method 400 may resume to step 430 by adjusting the aperture 170 for compensation illumination according to the intensity difference found at step 410 and step 420 by a proper calculation. Thus, each pair of radiation-transmitting regions is adjusted to a certain intensity accordingly. The adjusting relies on the mechanism of the aperture. For example, each glass is tuned to a specific tilt angle. In another example, a proper glass with a specific transmittance may be placed on each radiation-transmitting region. In another example, a radiation-blocking feature on each transmitting region may be shifted in or out to obtain a predetermined intensity. In another example, a pair of stacked polarizers may be rotated for a specific angle therebetween and a predetermined intensity. In another example, liquid crystal sandwiched between the crossed polarizers and controllable by two electrodes having different electric potentials. An expected intensity to each pole can be obtained by varying the corresponding voltage.

The calculation for the intensity difference may be alternatively replaced by searching a look-up table at step 440. The database to support this table may comes from a previous calculation, an engineer's experience, or the statistic from a manufacture line.

Then at step 450, the wafer result after the lithography process is estimated by using the data from step 410 and step 420, and by using the calculation from step 430 and/or step 440.

The method 400 may resume to step 460 by applying an asymmetric illumination through the aperture 170 adjusted at step 430 and/or step 440 to a substrate to be patterned. All the effects including the angular CD error on mask, the angular CD error/compensation from the illumination, and the angular CD error from the lithography tool will collectively impact the final wafer image.

The step 470 is to verify the final result on the wafer. The measurement will be feedback to database for wafer rework, or following candidate masks.

The wafer result measured at step 470 may be feedback to the system for wafer rework at step 480 in order to further reduce angle-depended CD difference. The wafer rework procedure may repeat the processing steps 450 through 470 until the angle-depended CD difference is substantially reduced.

The method 400 may be implemented when any relevant lithography processing parameter is changed. The relevant lithography processing parameter change may include but is not limited to: a new mask is used; radiation source has a drifting or fluctuation; and the configuration of the lithography system is changed. The above method 400 may have different variation when combined with various embodiments of the lithography system 100 to compensate angle-related CD errors or other angle-related imaging defects.

Thus, the present disclosure provide a lithography system. The system includes a source designed to provide energy; an imaging system configured to direct the energy onto a substrate to form a predefined image thereon, and defining an optical axis; and an aperture incorporated with the imaging system, the aperture having a plurality of transmitting regions defined along radial axis perpendicular to the optical axis, and each transmitting region operable to transmit energy with adjustable intensity.

In the lithography system, the aperture may be designed operable to compensate angular dependent critical dimension (CD) errors. The plurality of transmitting regions may include a first pair of regions disposed along a first diametrical axis not parallel to the optical axis, and a second pair of regions disposed along a second diametrical axis not parallel to the optical axis nor the first diametrical axis, wherein the first pair of regions are different from the second pair of regions in a way selected from the group consisting of shape, area, distance to the optical axis, transmittance, and combinations thereof. Each transmitting region may incorporate a transmitting substrate to utilize the adjustable intensity. The transmitting substrate may include a glass. The transmitting substrate may include a stencil structure. The transmitting substrate may be tilted for the adjustable intensity. The transmitting substrate may be tunable to cover a certain portion of the transmitting region for the adjustable intensity. The transmitting substrate may be replaceable for an expected intensity. Each transmitting region may be further operable to transmit the energy with adjustable parameter selected from the group consisting of intensity, phase, polarization, and combinations thereof. The plurality of transmitting regions may comprise an optical tunable material. The optical tunable material may include liquid crystal. The source may include an optical source selected from the group consisting of ultraviolet (UV) source, deep UV (DUV) source, extreme UV (EUV) source, and X-ray source. The source may include a particle source selected from the group consisting of electron beam (E-Beam) source, ion beam source, and plasma source. The lithography system may further include a substrate stage configured for securing and aligning the substrate. The lithography system may further include a photomask stage configured for securing and aligning a photomask having the predefined image.

The present disclosure also provides a lithography system. The system includes a radiation source designed to provide radiation energy; an imaging system configured to direct the radiation energy onto a substrate to form an image thereon; and an aperture incorporated with the imaging lens, having a first pair of radiation-transmitting regions positioned along a first diametrical axis, and having a second pair of radiation-transmitting regions positioned along a second diametrical axis not parallel to the first diametrical axis, wherein the first and second pairs of radiation-transmitting regions are designed and operable to transmit different radiation intensities.

In the lithography system, the first pair of radiation-transmitting regions may be further designed and operable to transmit radiation with an adjustable parameter selected from the group consisting of phase, polarization, and combinations thereof. The first pair of radiation-transmitting regions may be designed and operable to be different from the second pair of radiation-transmitting regions with a parameter selected from the group consisting of shape, area, distance to the center, transmittance, and combinations thereof.

The present disclosure also provide a method for lithography processing. The method includes providing a lithography system including an aperture designed to have a plurality of radiation-transmitting regions and operable to transmit adjustable radiation energy; adjusting the aperture to a relevant radiation intensity for each radiation-transmitting region; and applying radiation from a radiation source to the lithography system to form an image on a substrate, wherein a feature imaging error associated with its direction is compensated.

The method may further include finding the relevant radiation intensity for each radiation-transmitting region before the adjusting of the aperture. In the method, the adjusting of the aperture may include utilizing a radiation-transmitting plate with a certain transmittance. The radiation-transmitting plate with a certain transmittance may implemented with multi-coating technique. The asymmetric aperture may include at least one pair of radiation-transmitting regions disposed along a diametrical axis. The method may further include rotating the aperture after the applying of the radiation; adjusting the aperture to a second relevant radiation intensity for each radiation-transmitting region; and applying radiation from a radiation source to the lithography system to form a second image on a substrate.

The present disclosure has been described relative to a preferred embodiment. Improvements or modifications that become apparent to persons of ordinary skill in the art only after reading this disclosure are deemed within the spirit and scope of the application. It is understood that several modifications, changes and substitutions are intended in the foregoing disclosure and in some instances some features of the invention will be employed without a corresponding use of other features. Accordingly, it is appropriate that the appended claims be construed broadly and in a manner consistent with the scope of the invention.

What is claimed is:

1. A lithography system, comprising:
   a source for providing energy;
   an imaging system configured to direct the energy onto a substrate to form a predefined image thereon, the imaging system defining an optical axis; and
   an aperture incorporated with the imaging system, the aperture having a plurality of transmitting regions defined along a radial axis perpendicular to the optical axis, and each transmitting region operable to transmit the energy with adjustable intensity, wherein each transmitting region is individually adjusted for providing an asymmetric illumination to compensate angular-dependent critical dimension (CD) errors.

2. The lithography system of claim 1, wherein the plurality of transmitting regions comprises a first pair of regions disposed along a first diametrical axis not parallel to the optical axis, and a second pair of regions disposed along a second diametrical axis neither parallel to the optical axis nor the first diametrical axis, wherein the first pair of regions are different from the second pair of regions in a way selected from the group consisting of shape, area, distance to the optical axis, transmittance, and combinations thereof.

3. The lithography system of claim 1, wherein each transmitting region incorporates a transmitting substrate to utilize the adjustable intensity.

4. The lithography system of claim 3, wherein the transmitting substrate comprises a glass.

5. The lithography system of claim 3, wherein the transmitting substrate comprises a stencil structure.

6. The lithography system of claim 3, wherein the transmitting substrate is tilted for the adjustable intensity.

7. The lithography system of claim 3, wherein the transmitting substrate is tunable to cover a certain portion of the transmitting region for the adjustable intensity.

8. The lithography system of claim 3, wherein the transmitting substrate is replaceable for an expected intensity.

9. The lithography system of claim 1, wherein each transmitting region is further operable to transmit the energy with adjustable parameter selected from the group consisting of intensity, phase, polarization, and combinations thereof.

10. The lithography system of claim 1, wherein the plurality of transmitting regions comprises an optical tunable material.

11. The lithography system of claim 10, wherein the optical tunable material comprises liquid crystal.

12. The lithography system of claim 1, wherein the source comprises an optical source selected from the group consisting of ultraviolet (UV) source, deep UV (DUV) source, extreme UV (EUV) source, and X-ray source.

13. The lithography system of claim 1, wherein the source comprises a particle source selected from the group consisting of electron beam (E-Beam) source, ion beam source, and plasma source.

14. The lithography system of claim 1, further comprising a substrate stage configured for securing and aligning the substrate.

15. The lithography system of claim 1, further comprising a photomask stage configured for securing and aligning a photomask having the predefined image.

16. The lithography system claim 1, further comprising:
    a plurality of radiation blocking regions; and
    a mechanism for moving at least one of the radiation blocking regions to position allowing the at least one of the radiation blocking regions to overlap a portion of the radiation transmitting regions,
    wherein the plurality of the at least one of the plurality of radiation blocking regions is adjusted to compensate angular-dependent critical dimension (CD) errors.

17. A lithography system, comprising:
    a radiation source for providing a radiation energy;
    an imaging system configured to direct the radiation energy onto a substrate to form an image thereon; and
    an aperture incorporated with the imaging system, having a first pair of radiation-transmitting regions positioned along a first diametrical axis, and having a second pair of radiation-transmitting regions positioned along a second diametrical axis perpendicular to the first diametrical axis, wherein the first and second pairs of radiation-transmitting regions are designed and operable to transmit different radiation intensities, wherein each pair of radiation-transmitting regions are adjustable independently during exposure such that a first radiation energy through the first pair of radiation-transmitting regions and a second radiation energy through the second pair of radiation-transmitting regions are different to compensate angular-dependent critical dimension (CD) errors.

18. The lithography system of claim 17, wherein the first pair of radiation-transmitting regions are further designed and operable to transmit radiation with an adjustable parameter selected from the group consisting of phase, polarization, and combinations thereof.

19. The lithography system of claim 17, wherein the first pair of radiation-transmitting regions are designed and operable to be different from the second pair of radiation-transmitting regions with a parameter selected from the group consisting of shape, area, distance to the center, transmittance, and combinations thereof.

20. A method for lithography processing in a lithography system, comprising:
    providing an aperture designed to have a plurality of radiation-transmitting regions and operable to transmit adjustable radiation energy;
    adjusting individually the aperture to a relevant radiation intensity for each radiation-transmitting region to provide an asymmetric illumination; and
    applying radiation from a radiation source to the lithography system to form an image on a substrate, wherein an angular-dependent critical dimension (CD) error is compensated by the asymmetric illumination.

21. The method of claim 20, further comprising finding the relevant radiation intensity for each radiation-transmitting region before the adjusting of the aperture.

22. The method of claim 20, wherein adjusting of the aperture comprises utilizing a radiation-transmitting plate with a certain transmittance.

23. The method of claim 22, wherein the radiation-transmitting plate with a certain transmittance is implemented with multi-coating technique.

24. The method of claim 20, wherein the asymmetric aperture comprises at least one pair of radiation-transmitting regions disposed along a diametrical axis.

25. The method of claim 20, further comprising:
    rotating the aperture after the applying of the radiation;
    adjusting the aperture to a second relevant radiation intensity for each radiation-transmitting region; and
    applying radiation from a radiation source to the lithography system to form a second image on a substrate.

26. A lithography system, comprising:

a source for providing energy;

an imaging system configured to direct the energy onto a substrate to form a predefined image thereon, the imaging system defining an optical axis; and an aperture incorporated with the imaging system, the aperture having a first pair of transmitting regions disposed along a first diametrical axis not parallel to the optical axis and a second pair of transmitting regions disposed along a second diametrical axis neither parallel to the optical axis nor the first diametrical axis, wherein the first pair of transmitting regions are covered by a first type of glasses with a first transmittance greater than zero and the second pair of transmitting regions are covered by a second type of glasses with a second transmittance greater than zero and different from the first transmittance; and the first and the second transmittances are adjusted to compensate angular-dependent critical dimension (CD) errors.

* * * * *